(12) United States Patent
Doraisamy et al.

(10) Patent No.: US 9,136,399 B2
(45) Date of Patent: Sep. 15, 2015

(54) SEMICONDUCTOR PACKAGE WITH GEL FILLED CAVITY

(71) Applicants: Stanley Job Doraisamy, Kuala Lumpur (MY); Soon Kang Chan, Tmn Bkt Segar Jaya (MY); Soo Choong Chee, Shah Alam (MY)

(72) Inventors: Stanley Job Doraisamy, Kuala Lumpur (MY); Soon Kang Chan, Tmn Bkt Segar Jaya (MY); Soo Choong Chee, Shah Alam (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 57 days.

(21) Appl. No.: 14/086,919

(22) Filed: Nov. 21, 2013

(65) Prior Publication Data

US 2015/0137278 A1  May 21, 2015

(51) Int. Cl.
*H01L 29/84* (2006.01)
*H01L 23/24* (2006.01)
*H01L 21/50* (2006.01)

(52) U.S. Cl.
CPC ............. *H01L 29/84* (2013.01); *H01L 21/50* (2013.01); *H01L 23/24* (2013.01); *H01L 2224/48091* (2013.01); *H01L 2224/48137* (2013.01)

(58) Field of Classification Search
CPC ....... H01L 33/48; H01L 33/52; H01L 33/005; H01L 33/00
USPC ............. 257/99, 700; 156/242, 309.9; 438/29
See application file for complete search history.

(56) References Cited

U.S. PATENT DOCUMENTS

| 5,357,673 | A | 10/1994 | Polak | |
|---|---|---|---|---|
| 7,145,253 | B1 * | 12/2006 | Kim et al. | 257/790 |
| 7,956,451 | B2 | 6/2011 | Carberry | |
| 2010/0055815 | A1 * | 3/2010 | Kim et al. | 438/29 |
| 2011/0240212 | A1 | 10/2011 | McMahan | |
| 2012/0104583 | A1 | 5/2012 | Lee | |
| 2012/0306031 | A1 | 12/2012 | Lo | |

* cited by examiner

*Primary Examiner* — Selim Ahmed
*Assistant Examiner* — Changhyun Yi
(74) *Attorney, Agent, or Firm* — Charles Bergere

(57) ABSTRACT

A semiconductor device package is assembled using a jig that alters the shape of gel material disposed in a cavity in the package. In one embodiment, a jig having a concave bottom surface is inserted onto uncured gel material disposed within a cavity in a housing of the package to change a top surface of the gel from having a concave shape to a convex shape. The gel is then cured with the jig in place. When the jig is subsequently removed, the cured gel retains the convex shape, which helps to avoid any bond wires from being exposed. The re-shaped gel material reduces internal stresses during thermal cycling and can therefore reduce permanent damage to the package otherwise resulting from such thermal cycling.

7 Claims, 1 Drawing Sheet

SEMICONDUCTOR PACKAGE WITH GEL FILLED CAVITY

BACKGROUND OF THE INVENTION

The present invention relates generally to semiconductor device packages, and more particularly to packages with a gel filled cavity.

For certain semiconductor device packages, such as those that include pressure-sensing dies, it is known to apply a pressure-sensitive gel material over the pressure-sensing die to protect the die while still allowing the die to sense the atmospheric pressure outside of the package.

In some package designs having one or more dies, the gel fills the entire bottom portion of the package housing and is intended to cover all of the dies as well as any bond wires used to connect the dies to one another and/or to package leads. Unfortunately, due to the mechanical properties of some gels and some housing materials, when the gel is dispensed into the cavity, the gel's meniscus behavior results in the top surface of the gel having a concave shape. The concavity of the gel can increase during staging and curing, where staging refers to the time period from the dispensing of the gel until the beginning of the curing process.

FIGS. 1(A) and 1(B) show simplified cross-sectional side views of a conventional partially assembled semiconductor device package 100 having two dies 102 and 104 mounted within a package housing 106 that is partially filled with gel 108 and having at least one interconnecting bond wire 110. Other bond wires, if any, are not shown. FIG. 1(A) shows the package 100 just after the gel 108 has been dispensed, while FIG. 1(B) shows the package 100 after the gel 108 has been cured.

As shown in FIG. 1(A), the uncured gel 108 has a slightly concave top surface, while the top surface of the cured gel 108 in FIG. 1(B) has greater concavity. This greater concavity can result from the uncured gel 108 creeping up the walls of the housing 106 due to capillary action and/or shrinkage of the gel 108 during the curing process.

Unfortunately, as represented in FIG. 1(B), the increase in the concavity of the gel 108 can result in the exposure of portions of one or more of the bond wires 110 outside of the cured gel.

Furthermore, the concavity of the cured gel 108 in FIG. 1(B) corresponds to a relatively large variation in the thickness of the gel 108 across the width of the package 100, with the gel 108 being thicker at the edges of the package and thinner at the middle of the package.

Conventional package qualification processes involve thermal cycling during which the fully assembled packages are repeatedly heated up and cooled down over the range of expected operating temperatures for the package. The varying gel thickness across the width of the package can result in relatively large internal stresses during thermal cycling that can cause permanent damage to the package, such as broken and/or disconnected bond wires. Accordingly, it would be advantageous to have an assembly process that ensures the bond wires are covered with gel.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method of assembling a semiconductor device package. The method includes (a) dispensing uncured gel material into a cavity of a partially assembled semiconductor device package, where the package includes at least one die mounted within a package housing, and where the gel material has a top surface with a first shape; (b) applying a jig over the uncured gel material to change the top surface of the uncured gel material to have a second shape different from the first shape; (c) curing the uncured gel material with the applied jig; and (d) removing the jig such that the top surface of the cured gel material substantially retains the second shape.

In another embodiment, the present invention is a semiconductor device package assembled in accordance with the above-described method.

In yet another embodiment, the present invention provides a semiconductor device package comprising a package housing, at least one die mounted within the package housing, one or more bond wires connected to the at least one die, and cured gel material covering the at least one die and filling a bottom portion of the package housing, wherein a top surface of the cured gel material has a convex shape.

Figure 1A:
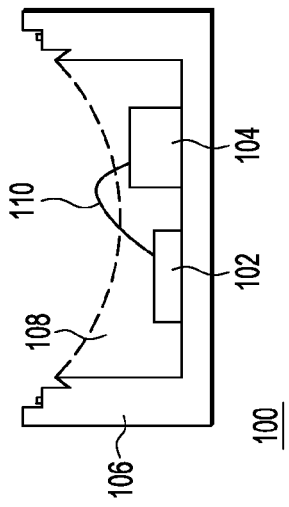
FIGS. 1(A) and 1(B) show simplified cross-sectional side views of a conventional partially assembled semiconductor device package having, respectively, uncured and cured gel material.
Figure 2A:
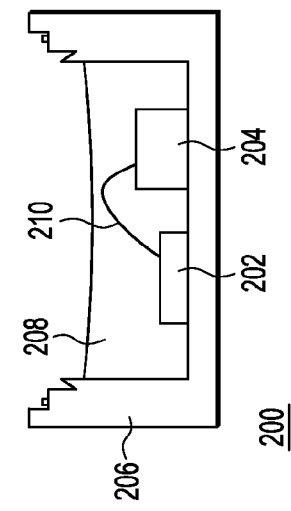
FIGS. 2(A)-(C) show simplified cross-sectional side views of three different steps in the assembly of a semiconductor device package according to an exemplary embodiment of the present invention.
Figure 2B:
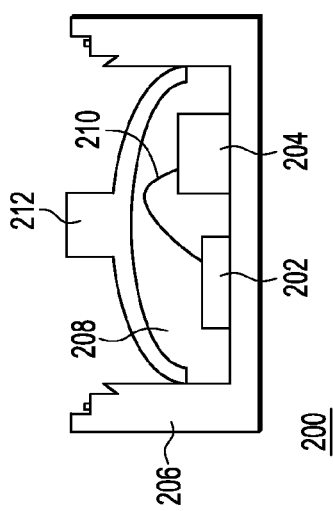
Figure 2C:
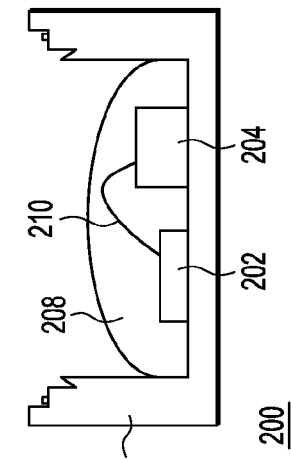

Referring now to FIGS. 2(A)-(C), simplified cross-sectional side views of three different steps in the assembly of a semiconductor device package 200 are shown. The package 200 has two dies 202 and 204 mounted within a package housing 206. In a preferred embodiment, at least one of the dies is a pressure sensor die. The housing 206 may comprise a multi-layer substrate or a pre-molded lead frame, having molded sidewalls formed thereon. The housing 206 is at least partially filled with a gel 208 that covers the dies 202 and 204, or at least the pressure sensing die. The two dies 202, 204 may be connected to each other and/or to a substrate bond pad with bond wires 210, one of which is shown. It is preferred that the gel 208 also covers the bond wires 210. FIG. 2(A), which is analogous to FIG. 1(A), shows the partially assembled package 200 just after the gel 208 has been dispensed into a cavity formed by the housing 206, with a top surface of the gel 208 automatically assuming a concave shape.

As shown in FIG. 2(B), before the gel 208 is cured, a jig (i.e., tool) 212, having a bottom surface with a concave shape and lateral dimensions corresponding to the lateral dimensions of the housing cavity, is inserted into the package housing 206 and pressed into the gel 208, such that the top surface of the gel assumes the shape of the bottom surface of the jig 212. The gel 208 is then cured with the jig 212 in place. The jig 208 subsequently is removed after the curing process is complete (or at least after the gel 208 has solidified enough to retain the shape imposed by the jig 212).

Although not represented in the cross-sectional views of FIG. 2, if the housing 206 has a cylindrical cavity, then the jig 212 will have a circular lateral shape that substantially matches the cylindrical cavity. Alternatively, if the housing 206 has a rectilinear cavity, then the jig 212 will have a rectangular lateral shape that substantially matches the rectilinear cavity.

FIG. 2(C) shows the package 200 after the gel 208 has been cured and the jig 212 has been removed. As shown in FIG. 2(C), the top surface of the cured gel 208 has a convex shape that substantially matches the concave shape of the bottom surface of the jig 212.

Figure 1B:
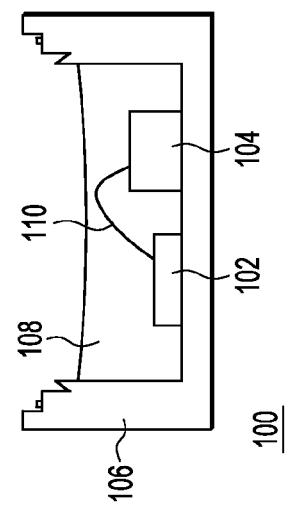

As a result of that convex shape, all of the bond wires 210 are completely covered by the cured gel 208. Furthermore, as also a result of the convex shape and taking into account (e.g., subtracting) the thicknesses of the one or more dies 202, 204, the variation in the thickness of the gel 208 in FIG. 2(C) is less than the variation in the gel thickness in FIG. 1(B). As such, the internal stresses during thermal cycling of the package 200 will be less than the internal stresses during thermal cycling on the corresponding, conventional package 100, which stress reduction can reduce the incidence of permanent damage to the package 200 as compared to the package 100.

Although FIG. 2 represents the assembly of a single semiconductor device package, in practice, one- or two-dimensional arrays of multiple packages are assembled simultaneously, typically as part of a single multi-package structure before they are separated into individual packages. In such cases, a multi-jig structure can be used having an array of jigs, each similar to jig 212 and coinciding with a corresponding package housing in the multi-package structure.

By now it should be appreciated that there has been provided an improved semiconductor device package and a method of forming the semiconductor device package. Circuit details are not disclosed because knowledge thereof is not required for a complete understanding of the invention.

Although the invention has been described using relative terms such as "upper," "lower," "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A method for assembling a semiconductor device package, the method comprising:
   (a) dispensing uncured gel material over a partially assembled semiconductor device package comprising at least one die mounted within a cavity in package housing, wherein the package housing has sidewalls that form the cavity, and wherein the uncured gel material fills a bottom portion of the cavity and has a top surface with a first, concave shape;
   (b) applying a jig having a concave inner surface over the uncured gel material to change the top surface of the uncured gel material to have a second, convex shape different from the first shape;
   (c) curing the uncured gel material with the applied jig; and
   (d) removing the jig such that the top surface of the cured gel material substantially retains the second shape, and wherein the top surface of the gel material does not extend above a height of the cavity sidewalls.

2. The method of claim 1, wherein:
   the at least one die has one or more bond wires electrically connected thereto within the partially assembled semiconductor device package; and
   the top surface of the cured gel material completely covers the one or more bond wires.

3. The method of claim 2, further comprising:
   subjecting the semiconductor device package to thermal cycling, wherein internal stresses in the semiconductor device package are less for the cured gel material having the second shape than for corresponding cured gel material having the first shape.

4. The method of claim 1, wherein variance of the thickness of the uncured gel material having the first shape is greater than the variance of the thickness of the cured gel material having the second shape.

5. The method of claim 4, further comprising:
   subjecting the semiconductor device package to thermal cycling, wherein internal stresses in the semiconductor device package are less for the cured gel material having the second shape than for corresponding cured gel material having the first shape.

6. The method of claim 1, wherein the jig is part of an integrated array of jigs applied simultaneously to the uncured gel materials of a corresponding array of partially assembled semiconductor device packages.

7. A semiconductor device package assembled using the method of claim 1.

\* \* \* \* \*